United States Patent
Bruel

(10) Patent No.: US 7,435,614 B2
(45) Date of Patent: Oct. 14, 2008

(54) METHOD FOR TREATING A STRUCTURE TO OBTAIN AN INTERNAL SPACE AND STRUCTURE HAVING AN INTERNAL SPACE

(76) Inventor: Michel Bruel, Presvert No. 9, Veurey-Voroize (FR) F-38113

( * ) Notice: Subject to any disclaimer, the term of this patent is extended or adjusted under 35 U.S.C. 154(b) by 338 days.

(21) Appl. No.: 10/539,638

(22) PCT Filed: Dec. 4, 2003

(86) PCT No.: PCT/FR03/03584

§ 371 (c)(1),
(2), (4) Date: Jun. 16, 2005

(87) PCT Pub. No.: WO2004/065291

PCT Pub. Date: Aug. 5, 2004

(65) Prior Publication Data

US 2006/0246729 A1    Nov. 2, 2006

(30) Foreign Application Priority Data

Dec. 20, 2002    (FR)    .................................... 02 16401

(51) Int. Cl.
*H01L 21/00* (2006.01)
*G01F 1/692* (2006.01)

(52) U.S. Cl. ...................................... 438/53; 73/204.26
(58) Field of Classification Search ................... 438/53; 73/204.26
See application file for complete search history.

(56) References Cited

FOREIGN PATENT DOCUMENTS

| DE | 101 10 234 | 9/2002 |
|----|------------|--------|
| FR | 2 747 506  | 10/1997 |
| GB | 2 211 991  | 7/1989 |

*Primary Examiner*—W. David Coleman
(74) *Attorney, Agent, or Firm*—Young & Thompson

(57) ABSTRACT

A method for treating a structure, includes: providing an initial structure having at least one main part and a secondary part which have a contact interface with each other and elements constituting at least one zone to be treated capable of varying in thickness substantially perpendicularly to the interface under the effect of a treatment of its material; and applying the treatment to the zone of the initial structure so as to obtain a final structure such that the variation in the thickness of the zone forms an internal space extending between the parts over at least one zone of the interface and substantially parallel to the interface or within at least one of the parts, spaced apart and substantially parallel to the interface. The invention also concerns the structure with internal space resulting from the displacement of one part relative to another part of the structure.

27 Claims, 8 Drawing Sheets

FIG_1
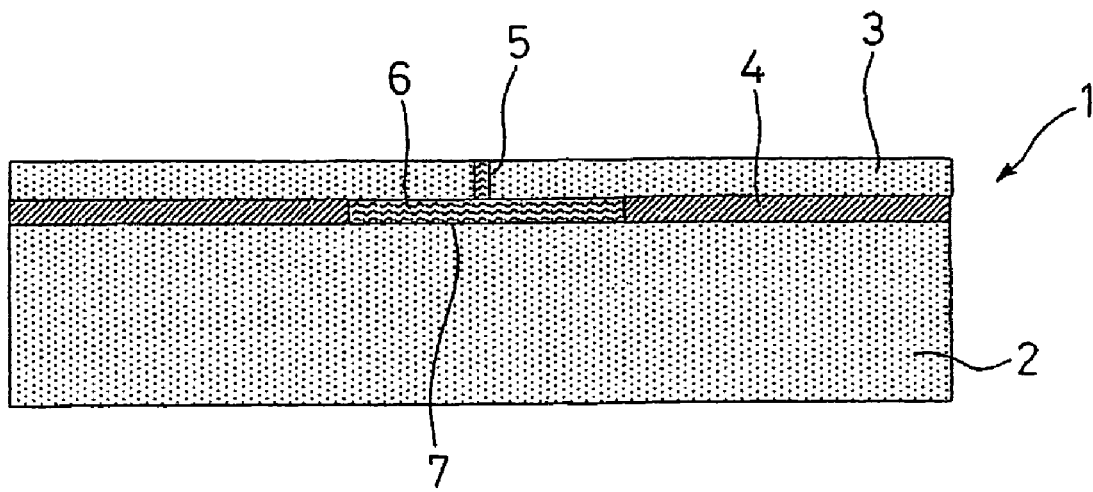
FIG_2
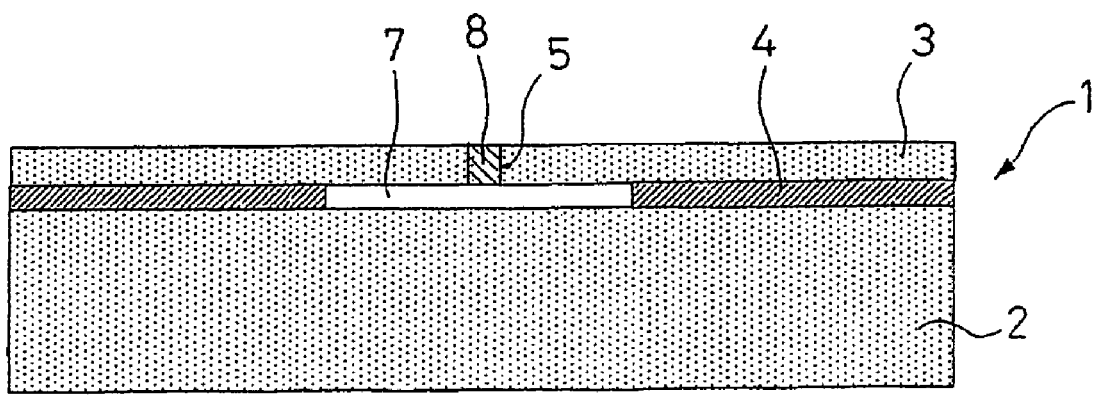

FIG_3
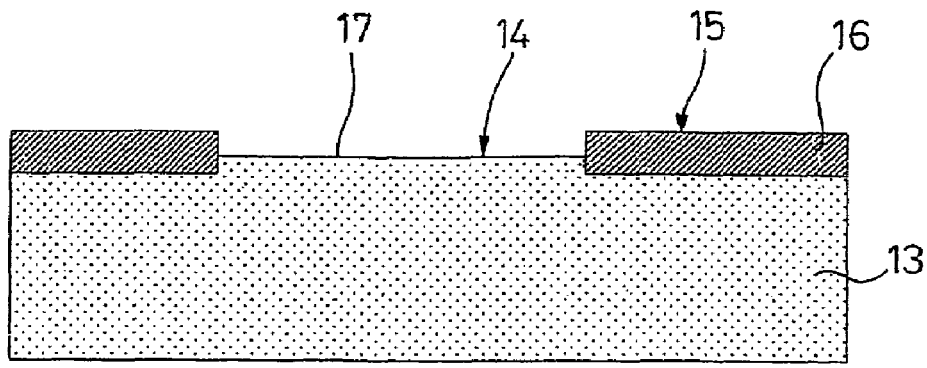
FIG_4
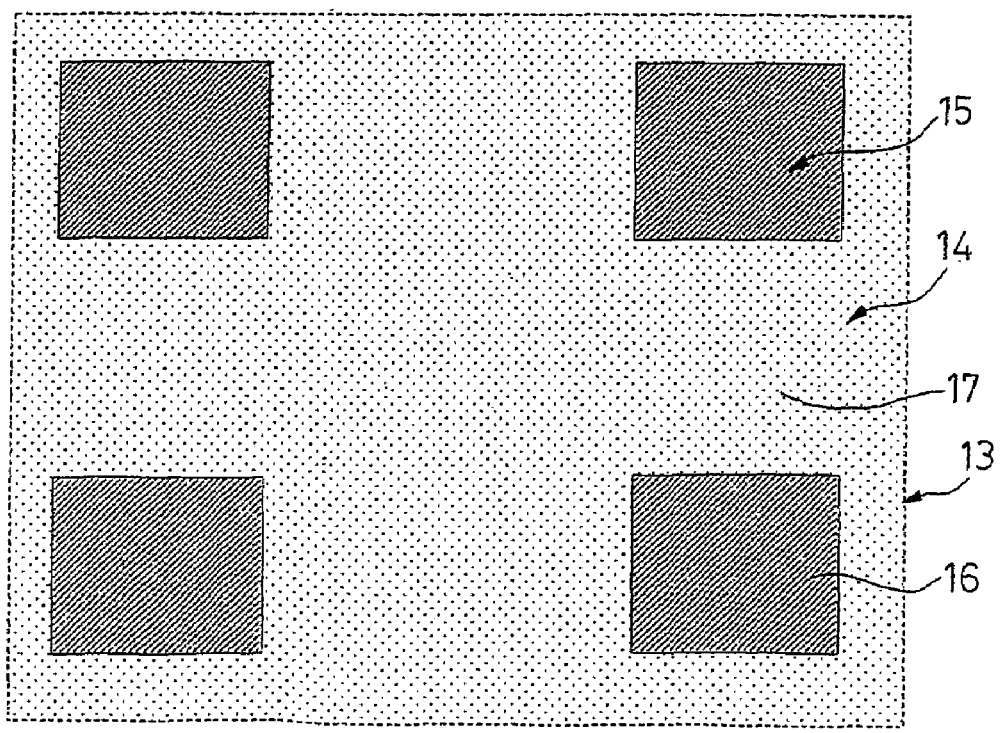

FIG_4a
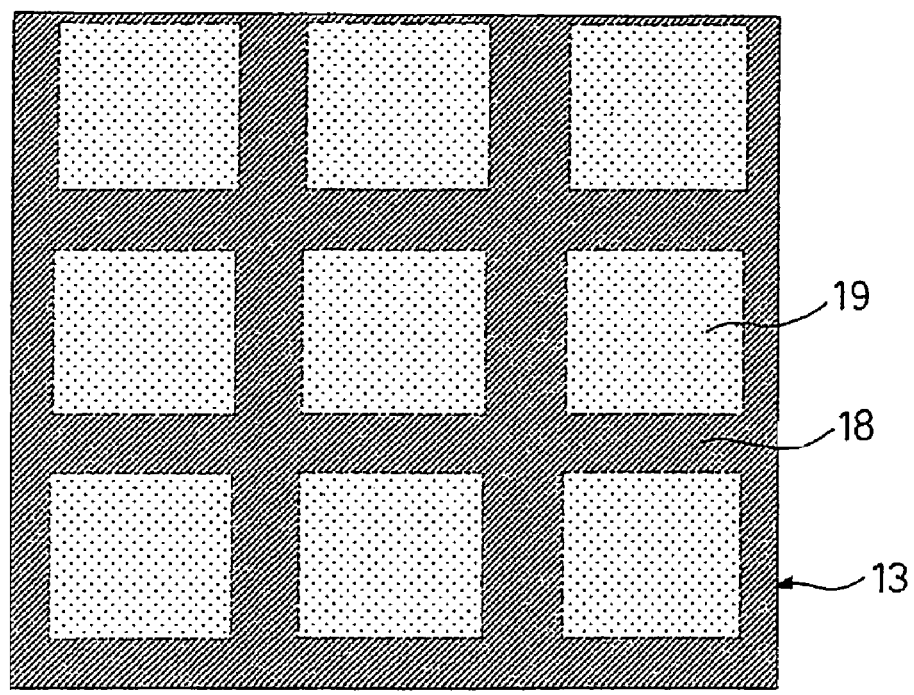
FIG_4b
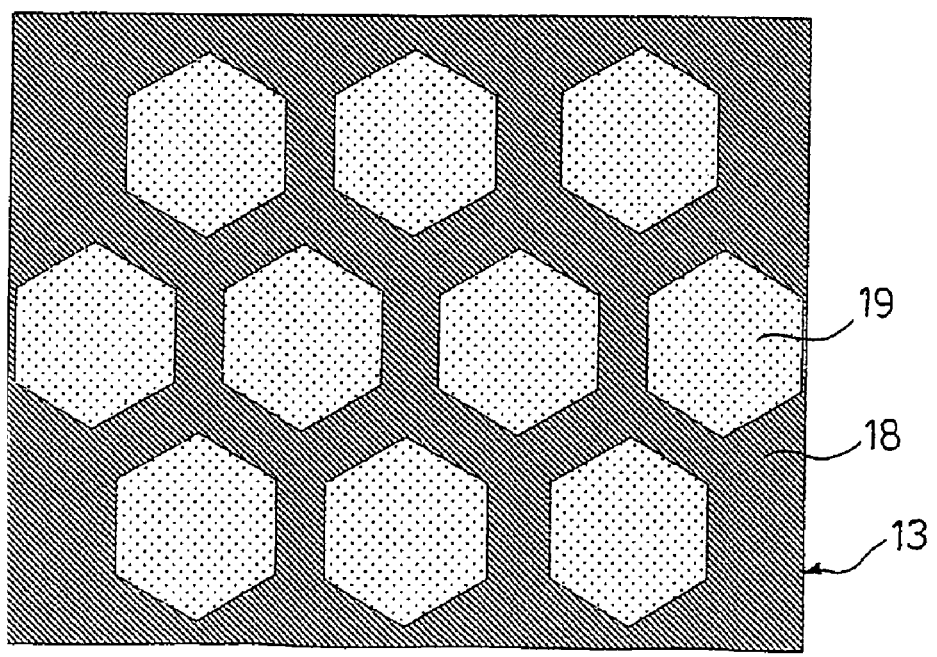

FIG_5
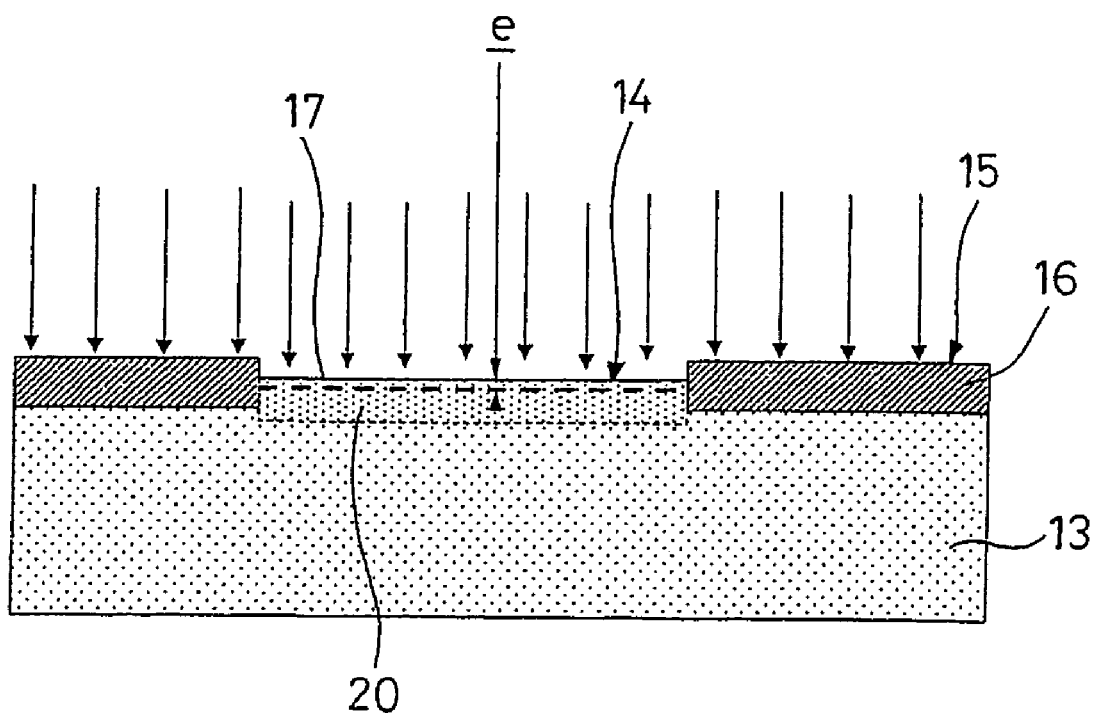

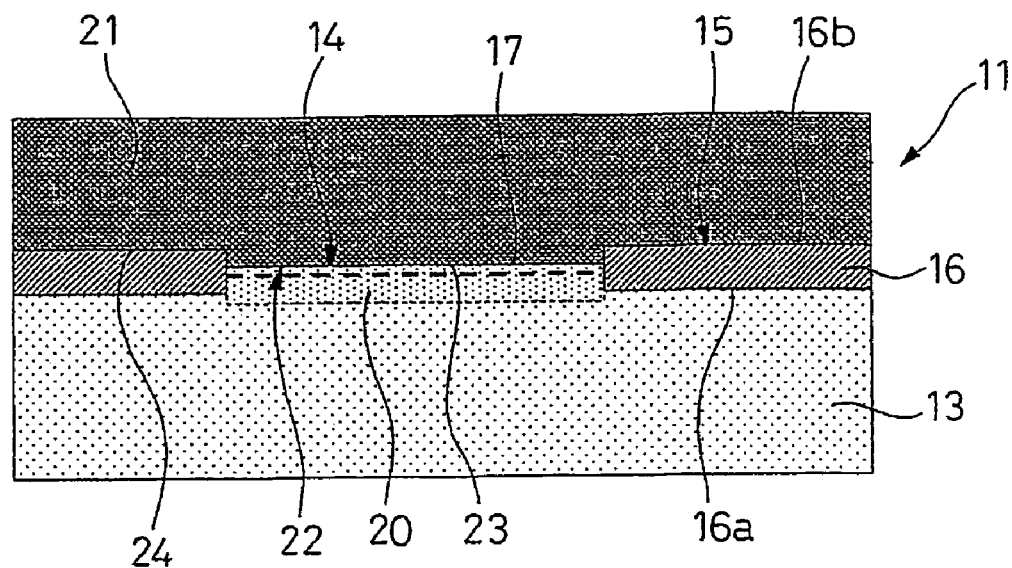
FIG_6
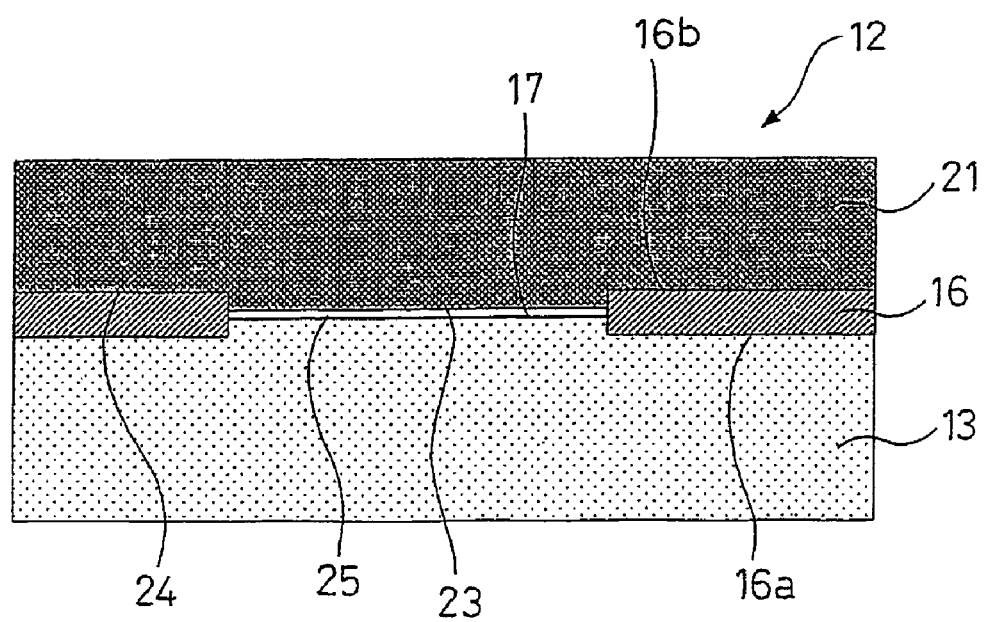
FIG_7

FIG_8
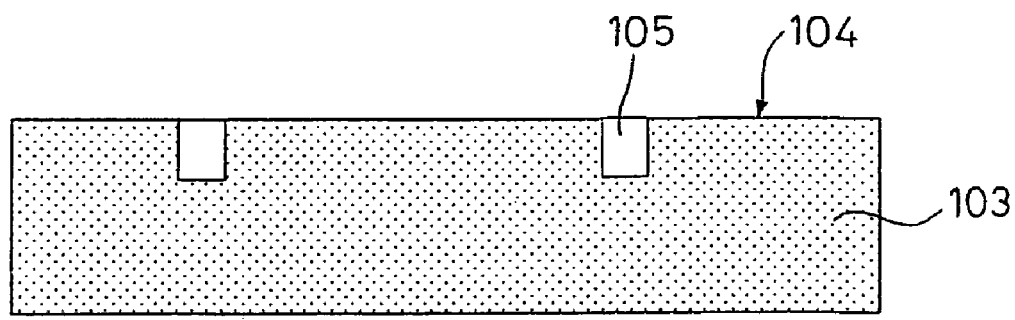
FIG_9
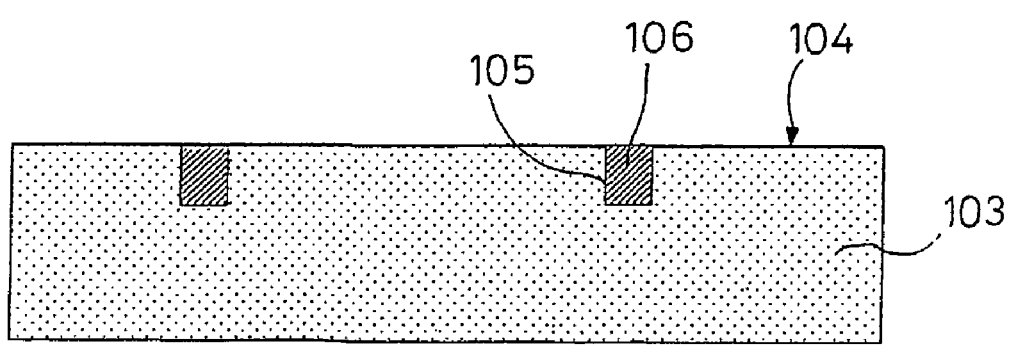

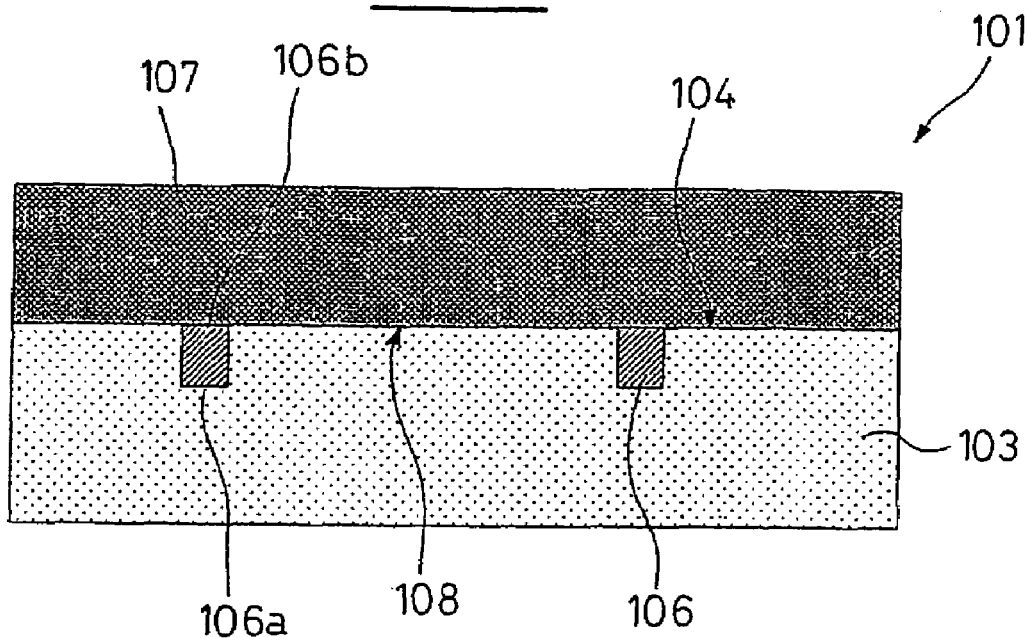
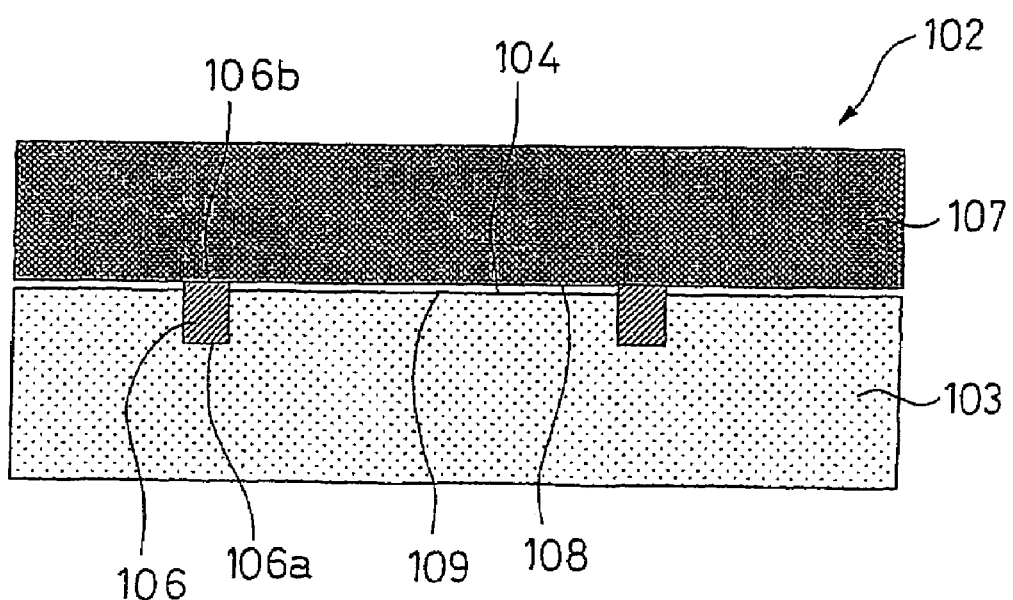

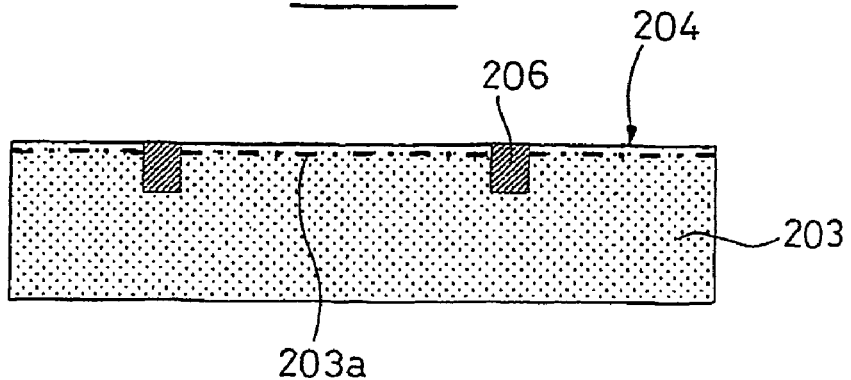
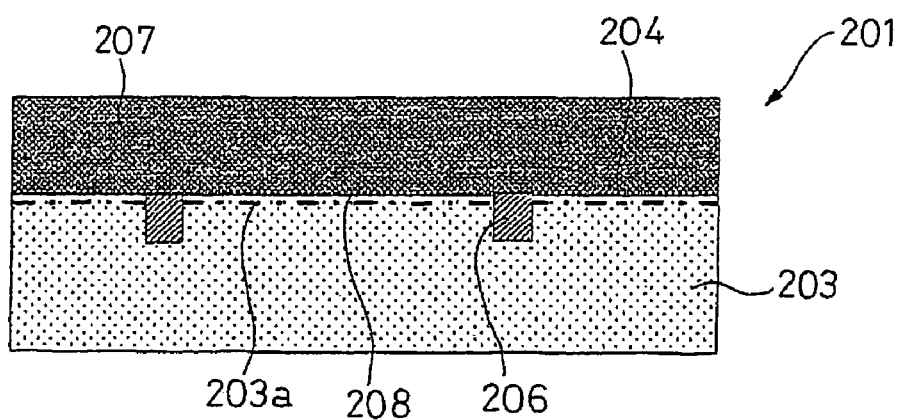
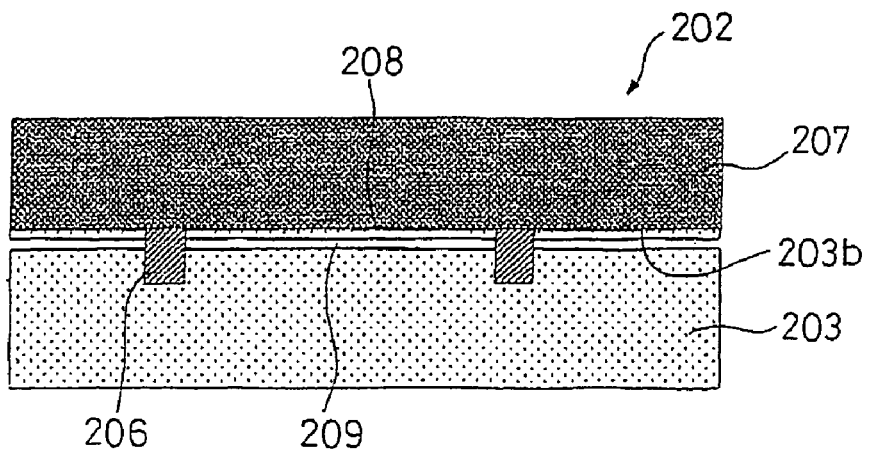

METHOD FOR TREATING A STRUCTURE TO OBTAIN AN INTERNAL SPACE AND STRUCTURE HAVING AN INTERNAL SPACE

The present invention relates to the field of structures, particularly multilayer structures, having an internal space of nanoscale or microscale thickness and in general extending over an area larger than its thickness.

In the field of Microsystems, for example for producing pressure sensors, it is particularly advantageous to produce a capacitive multilayer structure comprising a bulk silicon wafer and a membrane formed by a silicon film, the wafer and this membrane being separated by a layer of an insulator such as silicon oxide, in which structure an internal space is produced between the silicon wafer and the membrane in such a way that an external pressure variation results in a variation in the deformation of the membrane in the zone of the internal space, perpendicular to this space, thus causing a variation in the capacitance between the membrane and the wafer, the measurement of which allows the external pressure variation to be determined.

The technique currently used to produce such an internal space will be described below with reference to the appended FIGS. 1 and 2.

As may be seen in FIG. 1, it is known to produce a structure 1 comprising a silicon wafer or layer 2, for example with a thickness of approximately five hundred and fifty microns, and a silicon wafer or layer 3, for example with a thickness of approximately two microns, these being separated by a layer 4 of an insulator such as silicon oxide, for example with a thickness of approximately one micron.

A hole 5, generally with a diameter of approximately five hundred nanometers, is produced in the thinner wafer 3 and the insulator 4 is etched through this hole by a liquid etchant 6 so as to remove this insulator in a zone surrounding the hole and to obtain an internal space 7. Next, as FIG. 2 shows, the hole 5 is closed off by forming a plug 8, it being possible for the internal space 7 thus created, before being closed off, to be filled with one or more gas phases or for a vacuum to be created therein.

The inventor considers that such a procedure has many disadvantages and difficulties.

The depth of penetration of the liquid etchant between the two wafers, in order to etch the insulation layer, and the removal of the reaction products depend on the cross section of the bore produced and on the distance between the wafers, which determines the thickness of the internal space. The periphery of the internal space created has an outline whose length and geometry are difficult to control.

To be able to close up the hole 5 without the filling material 8 penetrating the internal space 7, this hole 5 must have a small diameter. Furthermore, in order for it to be technically possible to produce this hole, the thickness of the wafer 3 must be small. Under these conditions, the wafer 3 can deform and it is difficult to obtain an internal space of uniform thickness.

Consequently, it is difficult, or even impossible, to find a technical compromise that makes it possible to obtain an internal space of nanoscale or microscale thickness, that is to say a thickness that may lie between a fraction of a nanometer and a few microns, which internal space has a relatively large area and a periphery of defined outline, to use wafers one of which has a small thickness, and to avoid such a wafer deforming under the effect of the surface tension exerted by the liquid etchant.

One method of creating an internal space between two electrodes by removal of material from an intermediate layer has also been described in document WO-A-99/13562.

The inventor has demonstrated that multilayer structures with internal spaces of nanoscale or microscale thickness may be of great benefit in many other fields of application.

In particular, it would be advantageous to be able to produce nanoscale spaces of approximately uniform thickness, under vacuum, between the two electrodes of a system that involves electron field emission in such a space, particularly through a tunnel effect, so as to obtain the intense electric fields needed to produce these emission effects, while still using relatively low electrical voltages. It would also prove to be particularly beneficial to be able to produce internal spaces of large area in multilayer structures so as to obtain diodes of high capacity in terms of current. Such structures would find applications in particular in the field of thermal systems using the Peltier effect, particularly in refrigeration systems as described in the journal Applied Physics Letters. Volume 78, pages 2572-2574 of Apr. 23, 2001.

The object of the present invention is to produce structures, particularly multilayer structures, having internal spaces of nanoscale or microscale thickness, without being constrained by the aforementioned difficulties and drawbacks.

The subject of the present invention is firstly a method of treating a structure which consists: in producing an initial structure comprising at least a main part and a secondary part, which have a mutual contact interface, and means formed from at least one region to be treated, which can vary in thickness approximately perpendicular to this interface due to the effect of a treatment of the material forming said region; and in applying this treatment to said region to be treated of said initial structure so as to produce a final structure such that the variation in thickness of said region causes the formation of an internal space extending between said parts over at least one zone of said interface and approximately parallel to this interface or on the inside of at least one of said parts, some distance from and approximately parallel to said interface.

According to the invention, said means formed from at least one region to be treated are preferably integrated into said main part and/or into said secondary part.

The subject of the present invention is also a method for treating a structure which consists: in producing an initial structure comprising at least a main part and a secondary part, which have a mutual contact interface, and at least one of which parts has at least one region to be treated, said region being adjacent or close to said interface and able to be reduced in thickness approximately perpendicular to this interface due to the effect of a treatment; and in applying this treatment to said region to be treated of said initial structure so as to produce a final structure such that the reduction in thickness of said region causes the formation of an internal space extending between said parts over at least one zone located in said interface and approximately parallel to this interface or on the inside of at least one of said parts, some distance from and approximately parallel to said interface.

According to the present invention, the method may advantageously consist in producing an initial structure comprising at least one complementary part having opposed faces that bear on said main and secondary parts, respectively, approximately parallel to said interface, said region to be treated lying in the vicinity of this complementary part and said treatment producing a reduction in the thickness of this region to be treated.

According to the present invention, said complementary part may advantageously comprise at least two spaced-apart portions, said region to be treated lying between these two portions and said treatment producing a reduction in the thickness of this region to be treated.

According to the present invention, said region to be treated preferably results from an amorphizing ion implantation into at least one of said parts, causing the constituent material to swell, and said treatment consists in recrystallizing, preferably by epitaxial regrowth, at least part of the amorphized region so as to produce a reduction in its thickness.

According to the present invention, one of said faces of said complementary part preferably lies in the plane of said interface.

According to the present invention, said complementary part preferably comprises at least one pad or wall.

The subject of the present invention is also a method which consists: in producing an initial structure comprising at least a main part and a secondary part, which have a mutual contact interface, and at least one complementary part having opposed faces that bear on said main and secondary parts, respectively, approximately parallel to said interface, and comprising at least one region to be treated that is capable of increasing in thickness approximately perpendicular to said interface due to the effect of a treatment; and in applying this treatment to said region to be treated of said initial structure so as to produce a final structure such that the increase in thickness of said region of said complementary part causes a displacement of said main and secondary parts relative to each other, at least in the vicinity of said complementary part, and causes the formation of an internal space extending between said main and secondary parts over at least one zone of said interface and approximately parallel to this interface or on the inside of at least one of said parts, some distance from and approximately parallel to said interface.

According to the present invention, said complementary part preferably comprises at least two spaced-apart portions comprising at least one respective region to be treated that is capable of increasing in thickness approximately perpendicular to said interface due to the effect of a treatment, and the application of this treatment to these regions preferably causes a displacement of said main and secondary parts relative to each other, at least in the vicinity of said portions, and causes the formation of an internal space extending over at least one zone of said interface, at least between said spaced-apart portions, and approximately parallel to this interface or on the inside of at least one of said parts, some distance from and approximately parallel to said interface.

According to the present invention, one of said faces of said complementary part preferably lies in the plane of said interface.

According to the present invention, said complementary part preferably comprises at least one pad or wall.

According to the present invention, said treatment may advantageously consist in producing gas bubbles in said region to be treated, so as to cause said increase in thickness of said complementary part.

According to the present invention, said main and secondary parts preferably comprise superposed layers with a flat interface, at least in the zone of said space to be formed, at least one of which layers comprises a semiconductor material.

According to the present invention, said region to be treated preferably contains at least one material capable of undergoing a heat treatment that causes its thickness to vary.

According to the present invention, at least one of said parts may advantageously include a weakened zone in which said internal space forms.

According to a variant of the present invention, said weakened zone may be obtained by ion implantation.

According to the present invention, the adhesion of said layers to one another is preferably greater than the strength of said weakened zone.

Another subject of the present invention is a structure which comprises at least two superposed layers, at least one of which comprises a semiconductor material.

According to the invention, said structure has an internal space that extends between said layers over at least one zone of their interface and approximately parallel to this interface or that extends on the inside of at least one of said layers over at least one zone lying some distance from and approximately parallel to said interface.

Said structure furthermore includes means constituting an integrated region having been varied in thickness approximately perpendicular to said interface due to the effect of a treatment of the constituent material in order to cause the formation of said internal space by displacement of the surface of at least one of said layers in said zone of said space or by rupture of the aforementioned layer in its aforementioned zone lying some distance from and approximately parallel to said interface.

According to the present invention, said integrated region is preferably located in at least one of said layers and extends parallel to said space, this integrated region having decreased in thickness.

According to the present invention, said structure may advantageously comprise at least one complementary part having opposed faces that bear on one of said layers and on the other, respectively, approximately parallel to said interface, said space lying in the vicinity of this complementary part.

According to the present invention, said complementary part preferably comprises at least two spaced-apart portions, said space extending between these two portions.

According to the present invention, said structure may advantageously comprise at least one complementary part having opposed faces that bear on one of said layers and on the other, respectively, approximately parallel to said interface, and said integrated region is preferably located in this complementary part, this integrated region having increased in thickness and said space lying in the vicinity of this complementary part.

According to the present invention, said complementary part may advantageously comprise at least two spaced-apart portions, said space extending between these two portions and said integrated region is located in these portions.

According to the present invention, said structure may comprise at least one surface layer adjacent to or located in said interface, in particular a layer of carbon nanotubes.

According to the present invention, said zone lying some distance from and approximately parallel to said interface is preferably weakened.

According to the present invention, said complementary part preferably comprises at least one pad or wall.

The present invention will be more clearly understood upon examining structures with an internal space and embodiments of these structures, described by way of non-limiting examples and illustrated by the drawing in which:

FIG. 1 shows a cross section of the known structure described above, during one fabrication step;

FIG. 2 shows a cross section of the known structure of FIG. 1, after fabrication;

FIG. 3 shows a cross section of a first structure according to the invention at a first fabrication step;

FIG. 4 shows a top view of the structure of FIG. 3;

FIG. 4a shows a top view of a variant of the structure according to the invention;

FIG. 4b shows a top view of another variant of the structure according to the invention;

FIG. 5 shows a cross section of said first structure according to the invention at a second fabrication step;

FIG. 6 shows a cross section of said first structure according to the invention at a third fabrication step;

FIG. 7 shows a cross section of said first structure according to the invention at a final fabrication step;

FIG. 8 shows a cross section of a second structure according to the invention at a first fabrication step;

FIG. 9 shows a cross section of said second structure according to the invention at a second fabrication step;

FIG. 10 shows a cross section of said second structure according to the invention at a second fabrication step;

FIG. 11 shows a cross section of said second structure according to the invention at a final fabrication step;

FIG. 12 shows a third structure according to the invention, at one fabrication step;

FIG. 13 shows a cross section of said third structure according to the invention at a following fabrication step; and FIG. 14 shows a cross section of said third structure according to the invention at a final fabrication step.

A description will now be given, with reference to FIGS. 3 to 6, of the steps for obtaining an initial structure 11, making it possible, after a treatment, to obtain a final structure 12 shown in FIG. 7.

FIG. 3 shows a single-crystal silicon wafer 13 on the front face 14 of which a local oxide layer 15 has been produced, by known microelectronic techniques, so as to form a multiplicity of separate oxide pads 16 distributed over the front face 14, it being possible for this oxide layer 15 to be produced by oxidation of the silicon, in an oxidizing atmosphere in a furnace, or by deposition using any known process especially of the CVD or PECVD type. Thus, the front face 14 of the wafer 13 has an oxidation-free zone 17 in which the oxidized pads 16 are implanted.

To give an example, the depth of the oxidized layer 15 constituting the pads 16, relative to the face 14 of the wafer 13, may be about two hundred nanometers.

In the embodiment shown in FIGS. 3 and 4, the front faces of the pads 16 represent square areas, for example with sides of three microns, distributed with a pitch of ten microns.

In the embodiments shown in FIGS. 4a and 4b, the oxidized pads 16 have been replaced with continuous oxidized walls 18 constituting a grid that defines distributed separate unoxidized zones 19. In FIG. 4a, the zones 19 have a square perimeter and in FIG. 4b, the zones 19 have a hexagonal perimeter.

FIG. 5 shows that next an amorphizing ion implantation operation is performed, by any well-known means, on the front face 14 of the wafer 13 so as to create an amorphized surface region or layer 20 in the zone 17 not covered by the pads 16, or alternatively in the zones 19 not covered by the walls 18.

In a variant, at least the zone 17, or alternatively the zones 19, of the wafer 13 could be covered with a layer of another material, for example a layer of carbon nanotubes, through which layer the aforementioned ion implantation would take place.

It is known that silicon amorphization causes, in general, the material to swell and therefore the area thus treated to be increased, which swelling may be up to a few percent of the amorphized thickness.

In the article published in the journal Physics Research B 148, 1999, pages 573-577, the authors show that the swelling of amorphized SiC may lead to an increase in the treated area by possibly up to 10% of the thickness of the amorphized layer.

As an example, it may be chosen to implant silicon ions in the zone 17, or alternatively the zones 19, of the wafer 13, with an energy of 120 keV, a temperature of about 0° C. and a dose of around $2 \times 10^{15}$ to $6 \times 10^{15}$ per square centimeter. Under these conditions, it is possible to obtain an amorphized surface layer 20 on the zone 17 not covered with oxide, or alternately the zones 19, the thickness e of which is about 200 nanometers.

Thus, in the above example, the increase in area of the amorphized zone 6, or alternatively the zones 8, may be between about five nanometers and twenty nanometers, depending on the implanted dose.

FIG. 6 shows that next a thick rigid layer 21 is deposited on the front face 14 of the wafer 13, this layer having a rear face 22 that matches the shape of the front face 14 of this wafer. Thus, the pads 16, or alternatively the walls 19, have opposed faces 16a and 16b parallel to the interface 17-22 and bearing on the wafer 13 and the thick layer 21.

Preferably, conditions are chosen so as to create this layer 21 in such a way that, on the one hand, the zone 23 of its face 22 is poorly adherent to the unoxidized zone 17 of the wafer 13, or alternatively the zones 19, and in such a way that its zones 24 are adherent to at least one part of the front faces of the oxidized pads 16, or alternatively the walls 18.

In one example, the layer 21 may be formed by a first layer of tungsten about 100 nanometers in thickness deposited by cathode sputtering, followed by a second layer obtained by thick copper electroplating, with a thickness of about one hundred microns.

Furthermore, it is possible to carry out a heat treatment in order to densify the layer 21 so as to make it more compact and more rigid. Such a treatment may be carried out at a temperature of 350° C. for thirty minutes.

After this, the initial multilayer structure 11 is obtained.

In the example chosen above, a heat treatment of the initial structure 1 is then carried out within a temperature range lying between for example 550° C. and 850° C., preferably between 600° C. and 650° C., by placing the initial structure 11 in, for example, a furnace thus regulated for a few minutes or tens of minutes.

Thanks to this heat treatment, recrystallization of the previously amorphized surface region or layer 20 takes place by epitaxial regrowth. The initially amorphized layer is then converted into a crystalline layer of higher density, this crystallization causing a reduction in the thickness of the region or layer 20.

Since the wafer 13 and the attached layer 21 are held together, perpendicular to their interface 14-22, in the zone of the pads 16, or alternatively the walls 18, the reduction in the thickness of the surface region or layer 20 causes a displacement of the zone 17 of the front face 14 of the wafer 13, or alternatively the zones 19, in the direction away from the corresponding zone 23 of the thick layer 21 with which it was previously in contact. This displacement constitutes a retraction of the zone 17 of the wafer 13 perpendicular to the interface between this zone 17 and the zone 23 of the thick layer 21.

The above displacement or retraction causes the formation of an internal interface space 25 that extends over the zone 17 of the wafer and around the pad 16, or alternatively over the zones 18 and between the walls 19, the thickness of which lies parallel to the interface and corresponds approximately to the magnitude of the retraction.

Under the aforementioned conditions, the thickness of the internal space 25 obtained may be around five to twenty nanometers.

The steps for obtaining an initial structure 101 will now be described with reference to FIGS. 8 to 10, making it possible, after a treatment, to obtain a final structure 102 shown in FIG. 11.

FIG. 8 shows a single-crystal silicon wafer 103 in the front face 104 of which have been produced, for example by known etching techniques used in microelectronics, cavities or wells 105. These cavities may be uniformly distributed wells, with sides of three microns distributed with a pitch of ten microns, or continuous trenches, three microns in width, possibly intersecting so as to form a grid with a pitch of ten microns. In one embodiment, these cavities 105 may have a depth of between five hundred and two thousand nanometers.

As FIG. 9 shows, the cavities 105 are then filled with a material capable of swelling during a subsequent treatment.

For example, the surface 104 is coated with a layer of an oxide such as a phosphosilicate glass (PSG) highly doped with phosphorus, for example to about twelve percent, for example using a PECVD-type method, such a deposition filling the cavities 105. Next, a chemical-mechanical polishing treatment is applied so as to remove the oxide layer on the surface 104 of the wafer 103 to the outside of the cavities 105 and to planarize this surface and the outer surface of the material filling the cavities 105.

What is thus obtained in the cavities 105 are pads or walls 106, corresponding superficially to the pads 16 or walls 18 of the previous example and having a rear face 106a bonded to the bottom of the cavities 105.

Next, as shown in FIG. 10, the surface 104 and the pads or walls 106 are covered with a thick rigid layer 107, this layer 107 having a rear face 108 bonded to the surface 104 of the wafer 103 and to the front face 106b of the pads 106. This layer 107 may be of the same composition as the thick layer 21 of the previous example.

Thus, the pads or walls 106 have opposed faces 106a and 106b that bear on the wafer 103 and on the thick layer 107 respectively, these opposed faces lying approximately parallel to the interface formed by their bonded faces 104 and 108.

Preferably, this thick layer 107 is poorly adherent to the surface 104 of the wafer 103 and more strongly adherent to the outer surface of the pads or walls 106.

The initial multilayer structure 101 is therefore obtained.

Next, depending on the materials indicated above by way of example, this initial structure 101 is placed in a furnace set at a temperature of about 850 to 950° C. so as to apply a heat treatment to it.

Optionally, to prevent any deformation due to the atmospheric pressure, the heat treatments may be carried out in a vacuum or at low pressure.

Such a treatment acts on the constituent material of the pads or walls 106 and, in the example described, causes the formation of gas microbubbles in this material, thereby causing these pads or walls 106 to swell.

This swelling principally causes the thickness of the pads or walls 106 to increase perpendicular to the interface 104-108 between the wafer 103 and the thick layer 107.

This increase in thickness of the pads or walls 106, which bear on the wafer 103 and on the thick layer 107 via their opposed faces 106a and 106b respectively, generate forces that are approximately perpendicular to the interface 104-108 and produce a displacement of the wafer 103 and of the thick layer 107, relative to each other, perpendicular to the interface 104-108, after debonding of their faces 104 and 107 in their zones lying between the pads or walls 106.

This displacement results in the creation of an internal space 109 between the front face 104 of the wafer 103 and the rear face 108 of the thick layer 107, which are separated from each other, over the zone or the zones lying between the pads or walls 106, the thickness of which is approximately parallel to this interface.

The final structure 102 shown in FIG. 11 is therefore obtained.

In the abovementioned embodiment, the thickness of the internal space 109 could be between ten and forty nanometers.

The steps for obtaining an initial structure 201 will now be described with reference to FIGS. 12 and 13, making it possible, after a treatment, to obtain a final structure 202 shown in FIG. 14.

FIG. 12 shows, like at the step of the previous example described with reference to FIG. 9, a single-crystal silicon wafer 203 having a front face 204 in which pads or walls 206 are made from a material capable of swelling during a subsequent treatment.

In this variant, a zone 203a located depthwise in the wafer 203 and lying approximately parallel to the surface 204, is then weakened between the pads or walls 206. For example, this weakened zone may be obtained by implantation of hydrogen ions by any known technique, optionally followed by a heat treatment, and may be located at a distance from the surface 204 of between a few hundred nanometers and a few microns.

FIG. 13 shows that next, like in the step of the previous example described with reference to FIG. 10, a thick rigid layer 207 is deposited so as to cover the surface 104 and the pads or walls 106. Preferably, the adhesion of the layer 207 to the wafer 203, at their interface 208, is greater than the strength of the weakened zone 203a.

The initial structure 201 is therefore obtained.

Next, as in the step of the example described above with reference to FIG. 11, a treatment of the pads or walls 206 is carried out so as to make them swell.

This swelling generates forces that are approximately perpendicular to the interface 208 and cause the wafer 203 to rupture in the weakened zone 203. This rupture causes the appearance of an internal space 209 in this zone 203a, between the surface layer 203b of the wafer 203 that remains bonded to the thick layer 207 in the interface 209 and the remainder of this wafer 203, which are displaced relative to each other perpendicular to the interface 208.

Owing to the arrangement of the weakened zone mentioned above by way of example, this internal space 209 lies approximately parallel to the interface 204 and, under the same conditions, its thickness corresponds approximately to that obtained in the example described above with reference to FIG. 11.

The final structure 202 shown in FIG. 14 is therefore obtained.

The final structures 12, 102 and 202 that have just been described may be applied, without the examples below being limiting, in the field of MEMS (microelectromechanical systems), in order to produce pressure sensors, microphones and vibrators and in that of field-emission structures, in order to produce diodes, thermodynamic generators and refrigerating devices.

The present invention is not limited to the examples described above. In particular, the methods proposed for creating an internal space could be combined. The internal space created could extend over a limited and predetermined zone of the interface, in the latter or some distance away, and, in particular under these conditions the pads 16 of the first example described could be omitted. The proposed structures could be formed by wafers or layers or pads or walls made of materials other than those given by way of example, and they could include other layers made of other materials and optionally of intermediate layers.

Many other variants are possible without departing from the scope defined by the appended claims.

The invention claimed is:

1. A method of treating a structure, comprising:
    in producing an initial structure comprising at least a main part and a secondary part, which have a mutual contact interface, and means formed from at least one region to be treated, which can vary in thickness approximately perpendicular to this interface due to the effect of a treatment of the material forming said region and spaced-apart pads having opposed faces that bear on the main part and the secondary part respectively; and
    applying this treatment to said region to be treated of said initial structure so as to produce a final structure such that the variation in thickness of said region causes the formation of an internal space extending parallel to this interface and at least between the said spaced-apart pads and extending between said main and secondary parts over at least one zone of said interface or on the inside of at least one of said parts, some distance from said interface.

2. The method as claimed in claim 1, characterized in that said means formed from at least one region to be treated are integrated into said main part and/or into said secondary part.

3. The method as claimed in claim 1, characterized in that said main and secondary parts comprise superposed layers with a flat interface, at least in the zone of said space to be formed, at least one of which layers comprises a semiconductor material.

4. The method as claimed in claim 1, characterized in that said region to be treated contains at least one material capable of undergoing a heat treatment that causes its thickness to vary.

5. The method as claimed in claim 1, characterized in that at least one of said parts includes a weakened zone in which said internal space forms.

6. The method as claimed in claim 5, characterized in that said weakened zone is obtained by ion implantation.

7. The method as claimed in claim 5, characterized in that the adhesion of said layers to one another is greater than the strength of said weakened zone.

8. A method for treating a structure comprising:
    producing an initial structure comprising at least a main part and a secondary part, which have a mutual contact interface, and at least one of which parts has at least one region to be treated, said region being adjacent or close to said interface and able to be reduced in thickness approximately perpendicular to this interface due to the effect of a treatment and spaced-apart pads having opposed faces that bear on the main part and the second part respectively; and
    applying this treatment to said region to be treated of said initial structure so as to produce a final structure such that the reduction in thickness of said region causes the formation of an internal space extending parallel to this interface and at least between the said spaced-apart pads extending between said main and secondary parts over at least one zone located in said interface or on the inside of at least one of said parts, some distance from and approximately parallel to said interface.

9. The method as claimed in claim 8, characterized in that it consist in producing an initial structure comprising at least one complementary part having opposed surfaces that bear on said main and secondary parts, respectively, approximately parallel to said interface said region to be treated lying in the vicinity of this complementary part and said treatment producing a reduction in the thickness of this region to be treated.

10. The method as claimed in claim 9, characterized in that said complementary part comprises at least two spaced-apart portions said region to be treated lying between these two portions and said treatment producing a reduction in the thickness of this region to be treated.

11. The method as claimed in claim 8, characterized in that said region to be treated results from an amorphizing ion implantation into at least one of said parts, causing the constituent material to swell, and in that said treatment consists in recrystalizing, preferably by epitaxial regrowth, at least part of the amorphized region so as to produce a reduction in its thickness.

12. The method as claimed in claim 8, characterized in that one of said faces of said complementary part lies in the plane of said interface.

13. The method as claimed in claim 8, characterized in that said complementary part comprises at least one pad or wall.

14. A method for treating a structure characterized in that it consists:
    producing an initial structure comprising at least a main part and a secondary part, which have a mutual contact interface, and at least one complementary part having spaced apart pads as part of opposed faces that bear on said main and secondary parts, respectively, approximately parallel to said interface, and comprising at least one region to be treated that is capable of increasing in thickness approximately perpendicular to said interface due to the effect of a treatment; and
    applying this treatment to said region to be treated of said initial structure so as to produce a final structure such that the increase in thickness of said region of said complementary part causes a displacement of said main and secondary parts relative to each other, at least in the vicinity of said complementary part, and causes the formation of an internal space extending parallel to this interface and at least between the said spaced-apart pads and extending between said main and secondary parts over at least one zone of said interface or inside of at least one of said parts, some distance from said interface.

15. The method as claimed in claim 14, characterized in that said complementary part comprises at least two spaced-apart portions comprising at least one respective region to be treated that is capable of increasing in thickness approximately perpendicular to said interface due to the effect of a treatment, and in that the application of this treatment to these regions causes a displacement of said main and secondary parts relative to each other, at least in the vicinity of said portions, and causes the formation of an internal space extending over at least one zone of said interface, at least between said spaced-apart portions, and approximately parallel to this interface or on the inside of at least one of said parts, some distance from and approximately parallel to said interface.

16. The method as claimed in claim 14, characterized in that one of said faces of said complementary part lies in the plane of said interface.

17. The method as claimed in claim 14, characterized in that said complementary part comprises at least one pad or wall.

18. The method as claimed in claim 14, characterized in that said treatment consists in producing gas bubbles in said region to be treated, so as to cause said increase in thickness of said complementary part.

19. A structure comprising:
at least two superposed layers, at least one of which comprises:
a semiconductor material, that it has an internal space that extends between said layers over at least one zone of their interface and approximately parallel to this interface or that extends on the inside of at least one of said layers over at least one zone lying some distance from and approximately parallel to said interface, and in that it includes means constituting an integrated region having been varied in thickness approximately perpendicular to said interface due to the effect of a treatment of the constituent material in order to cause the formation of said internal space by spaced-apart pads on the surface of at least one of said layers in said zone of said space or by a spaced-apart rupture of the aforementioned layer in its aforementioned zone lying some distance from said interface.

20. The structure as claimed in claim 19, characterized in that said integrated region is located in at least one of said layers and extends parallel to said space, this integrated region having decreased in thickness.

21. The structure as claimed in claim 19;
characterized in that it comprises at least one complementary part having opposed faces that bear on one :of said layers and on the other, respectively, approximately parallel to said interface, said space lying in the vicinity of this complementary part.

22. The structure as claimed in claim 19, characterized in that it comprises at least one complementary part having opposed faces that bear on one of said layers and on the other, respectively, approximately parallel to said interface, and in that said integrated region is located in this complementary part, this integrated region having increased in thickness and said space lying in the vicinity of this complementary part.

23. The structure as claimed in claim 19, characterized in that it comprises at least one surface layer adjacent to or located in said interface, in particular a layer of carbon nanotubes.

24. The structure as claimed in claim 19, characterized in that said zone lying some distance from and approximately parallel to said interface is weakened.

25. The structure as claimed in claim 19, characterized in that said complementary part comprises at least one pad or wall.

26. The structure as claimed in claim 21, characterized in that said complementary part comprises at least two spaced-apart portions, said space extending between these two portions.

27. The structure as claimed in claim 22, characterized in that said complementary part comprises at least two spaced-apart portions, said space extending between these two portions and in that said integrated region is located in these portions.

* * * * *